(12) United States Patent
Dardona et al.

(10) Patent No.: US 11,786,974 B2
(45) Date of Patent: Oct. 17, 2023

(54) ADDITIVE MANUFACTURING OF ELECTRONICS HAVING BULK PROPERTIES

(71) Applicant: Hamilton Sundstrand Corporation, Charlotte, NC (US)

(72) Inventors: Sameh Dardona, South Windsor, CT (US); Paul Sheedy, Bolton, CT (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 1175 days.

(21) Appl. No.: 15/970,613

(22) Filed: May 3, 2018

(65) Prior Publication Data

US 2019/0337054 A1 Nov. 7, 2019

(51) Int. Cl.
*B22F 12/00* (2021.01)
*B33Y 10/00* (2015.01)
*B33Y 70/00* (2020.01)
*B33Y 30/00* (2015.01)
*B33Y 80/00* (2015.01)
(Continued)

(52) U.S. Cl.
CPC .............. *B22F 12/00* (2021.01); *B33Y 10/00* (2014.12); *B33Y 30/00* (2014.12); *B33Y 70/00* (2014.12); *B33Y 80/00* (2014.12); *B05D 1/26* (2013.01); *B05D 1/38* (2013.01); *B05D 3/0254* (2013.01); *B05D 3/065* (2013.01); *B05D 5/12* (2013.01); *H05K 1/092* (2013.01); *H05K 3/12* (2013.01);
(Continued)

(58) Field of Classification Search
CPC ........... B22F 3/1055; B22F 2003/1056; B33Y 10/00; B33Y 30/00; B33Y 70/00; B05D 1/26; B05D 1/38; B05D 3/0254; B05D 3/065; B05D 5/12; H05K 1/092; H05K 3/12; H05K 3/1208; H05K 3/1241; H05K 3/125; H05K 3/1283
USPC ................................ 427/58, 97.1, 98.4, 98.5
See application file for complete search history.

(56) References Cited

U.S. PATENT DOCUMENTS 5,392,982 A * 2/1995 Li ........................... B22F 1/025
228/121
6,384,345 B1 * 5/2002 Akiha .................. H05K 3/1241
148/24
(Continued)

FOREIGN PATENT DOCUMENTS

JP 2007019072 A 1/2007

*Primary Examiner* — Brian K Talbot
(74) *Attorney, Agent, or Firm* — Kinney & Lange, P. A.

(57) ABSTRACT

An embodiment of a method includes depositing a quantity of first intermediary material onto an electrically insulating substrate in a pattern corresponding to a desired pattern of a first conductive structure. The first intermediary material is adhered to the substrate to form a first intermediate layer to maintain the desired pattern of the first conductive structure. A quantity of a precursor of electrically conductive material is deposited generally along the pattern of the first intermediate layer. Energy is applied to enable migration and consolidation of the first electrically conductive material along the pattern of the first intermediate layer, forming a functional, electrically conductive top layer. At least one of the first electrically conductive material and its precursor has a wetting angle of less than 90° relative to the first intermediate layer, and a wetting angle greater than 90° relative to the substrate. At least one of the depositing steps is an additive deposition step.

18 Claims, 4 Drawing Sheets

(51) Int. Cl.

| | |
|---|---|
| B05D 3/06 | (2006.01) |
| H05K 3/12 | (2006.01) |
| B05D 1/26 | (2006.01) |
| H05K 1/09 | (2006.01) |
| B05D 1/38 | (2006.01) |
| B05D 5/12 | (2006.01) |
| B05D 3/02 | (2006.01) |

(52) U.S. Cl.
CPC ........... *H05K 3/125* (2013.01); *H05K 3/1208* (2013.01); *H05K 3/1241* (2013.01); *H05K 3/1283* (2013.01)

(56) References Cited

U.S. PATENT DOCUMENTS

| | | |
|---|---|---|
| 8,723,193 B2 | 5/2014 | Onodera et al. |
| 9,288,913 B2 | 3/2016 | Miura et al. |
| 9,352,351 B2* | 5/2016 | Sirvio ................. C23C 26/02 |
| 2006/0065955 A1* | 3/2006 | Sakurada ............ H05K 3/4647 |
| | | 257/659 |
| 2006/0093732 A1* | 5/2006 | Schut ................. C23C 18/1608 |
| | | 427/58 |
| 2007/0099396 A1 | 5/2007 | Hirai et al. |
| 2012/0114966 A1* | 5/2012 | Tuan ..................... B32B 18/00 |
| | | 428/613 |
| 2014/0345959 A1* | 11/2014 | Mair .................... B60K 17/356 |
| | | 180/55 |
| 2016/0135279 A1* | 5/2016 | Sheedy ................. F01D 17/02 |
| | | 73/112.01 |

* cited by examiner

ADDITIVE MANUFACTURING OF ELECTRONICS HAVING BULK PROPERTIES

BACKGROUND

The disclosure relates generally to additive manufacturing, and more particularly to methods and products having bulk-like properties such as electrical conductivity.

Electric system components often require operation-stable and homogenous materials with controlled properties and thus often manufactured using lamination, winding, or etching of conductors. Three dimensional organization of materials having varying properties is critical to optimization of device performance, yet optimal organization is often difficult due to manufacturing and processing constraints, sacrificing performance. Direct write technologies reduce manufacturing design constraints, yet the associated materials can exhibit lower performance (e.g. low conductivities) due to the resultant porosity and impurities and poor adhesion.

In some cases, additively manufactured conductors could hypothetically be consolidated via sintering or other elevated temperature processing in order to improve conductivity or other properties and approach bulk properties. However, the conditions (thermal and otherwise) required to eliminate porosity and other artifacts of additive processes often result in dispersion or reaction of the intended top layer relative to the substrate, overcoming any heretofore expected advantages of additive technologies for many common materials.

SUMMARY

An embodiment of a method includes depositing a quantity of first intermediary material onto an electrically insulating substrate in a pattern corresponding to a desired pattern of a first conductive structure. The first intermediary material is adhered to the substrate to form a first intermediate layer to maintain the desired pattern of the first conductive structure. A quantity of a precursor of electrically conductive material is deposited generally along the pattern of the first intermediate layer. Energy is applied to enable migration and consolidation of the first electrically conductive material along the pattern of the first intermediate layer, forming a functional, electrically conductive top layer. At least one of the first electrically conductive material and its precursor has a wetting angle of less than 90° relative to the first intermediate layer, and a wetting angle greater than 90° relative to the substrate. At least one of the depositing steps is an additive deposition step.

DETAILED DESCRIPTION

Figure 1:
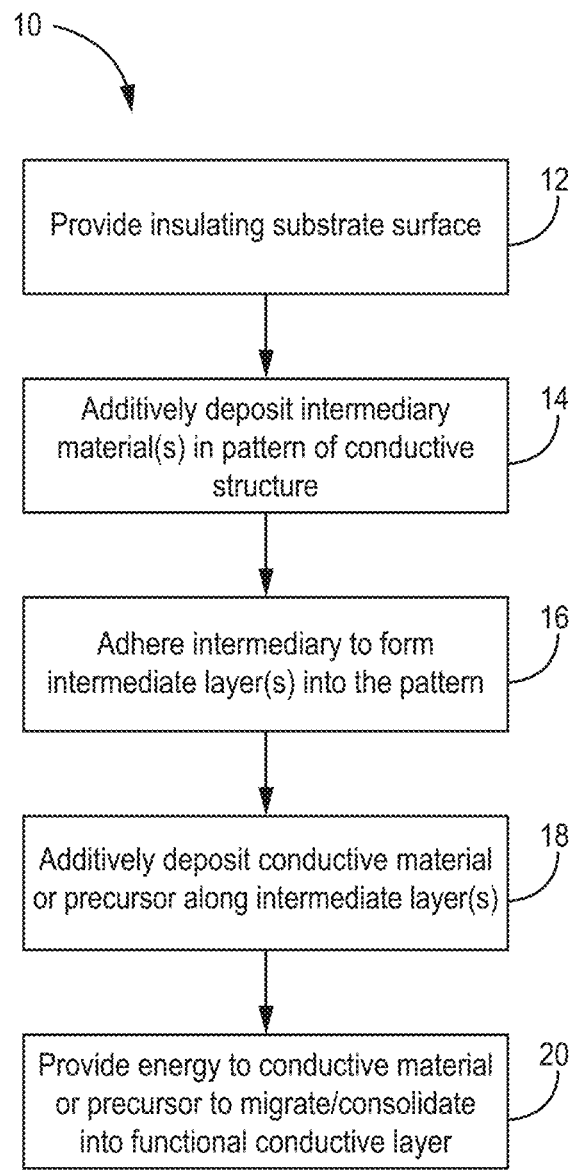
FIG. 1 illustrates an embodiment of a method according to the disclosure.

FIG. 1 shows generally method 10 for making an additively manufactured electrical element or electronic component. Examples are provided below, but generally the process enables complex structures to be formed with the flexibility of additive manufacturing while also providing bulk-like conductive properties previously achievable only through large scale electrodeposition, or expensive and complex vapor deposition processes. The conditions (thermal and otherwise) required to eliminate porosity and other artifacts of additive processes often result in dispersion or reaction of the intended top layer relative to the substrate, overcoming any heretofore expected advantages of additive technologies for many common materials.

Beginning with step 12, a substrate for an electrical component is provided, such as a working surface of an additive manufacturing device. The substrate has at least one layer which is electrically insulating relative to electrical conductors to be formed thereon in subsequent steps. This substrate or substrate layer can include, but is not limited to aluminum oxide, aluminum nitride, silicon nitride, boron nitride, beryllium oxide, zirconium oxide, silicon carbide, glass, glass-ceramic, and combinations thereof. In certain embodiments, the substrate has a metallic base including, but not limited to alloys of aluminum, nickel, iron, titanium, cobalt, chromium, silicon, and combinations thereof. An electrically insulating top layer as described above is then provided atop the metallic base, on which subsequent layers, including the conductor(s) are formed.

As part of step 14, on the working surface or other build location, a quantity of first intermediary material is deposited, additively or otherwise onto the substrate in a pattern corresponding to a desired pattern of a first conductive structure. Next, step 16 involves adhering the first intermediary material to the substrate to form a first intermediate layer on a portion of the substrate. This can be done based on the properties of the substrate and requirements of the intermediary material (e.g., an ink, paste, or the like), but sintering and curing are frequent approaches that can be taken.

Once the intermediate layer(s) are fixed in place, step 18 includes additively depositing a quantity of precursor to a first electrically conductive material generally along the pattern of first intermediary material. In certain embodiments, more than one layer of intermediary material is deposited and adhered in order to achieve the wetting, thermal, and electrical properties desired. The resulting composition of the top layer is selected to meet targeted device performance and specifications, and can non-limitingly include copper, platinum, palladium, nickel, chromium, or combinations thereof. Thus any suitable precursor to the selected top layer composition can be used to arrive at the desired electrically conductive material.

Moving to step 20, sufficient energy is provided to at least the first precursor to the electrically conductive material to enable migration and consolidation of the resulting electrically conductive material into a finished functional top, electrically conductive layer having desired bulk-like electrical properties.

With respect to steps 18 and 20, there is no explicit need to exactly replicate the pattern of the intermediate layer(s) when depositing the corresponding precursors for the top layer(s) nor are there substantial restrictions on the form of precursor material (carrier, etc.) used. This is because the flexibility and tolerance when depositing the material for the top layer rests in the relationship between the three or more materials. Here, one or both of the electrically conductive material and its precursor has a wetting angle of less than 90° relative to the first intermediate layer or adjacent intermediate layer (in the event there are multiple intermediate layers along the same pattern). The electrically conductive material has a wetting angle greater than 90° relative to the substrate. The concept and importance of these relative wetting angles will be discussed in the context below.

Ordinarily, conductive materials like copper and thermally resistant substrate materials like aluminum oxide, onto which conductors are often deposited, often have a high relative "wetting angle" between them. A wetting angle of more than about 90° in this case means that if liquid copper or similar material is directly in contact with the substrate (without at least one intermediate layer as described herein), the liquid metal will not form a uniform layer or coating.

When one attempts, for example, to additively deposit copper directly onto an alumina or similar insulating substrate surface (relative wetting angle of more than 90°), one of two issues occurs. When the substrate and additively deposited copper trace is heated in an attempt to consolidate the copper precursor and remove (via evaporation, combustion, etc.) the carrier materials used in the additive process, most of the resulting pure copper has been found to melt, then consolidate itself into balls on the substrate surface, destroying the shape of the circuit. Alternatively, while heat can be reduced to try to maintain the initial trace pattern, the copper will remain contaminated by remaining carrier materials and/or residual porosity, significantly reducing or even completely eliminating the conductivity through the circuit, particularly since the conductivity of copper is sensitive to even minimal amounts of porosity and impurities.

Figure 2:
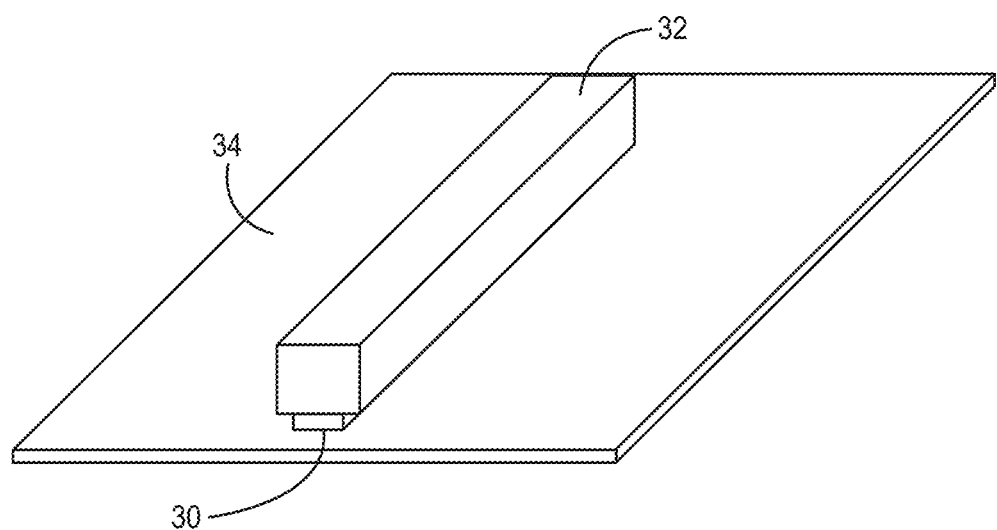
FIG. 2 schematically shows an example embodiment of an intermediate layer and basic copper trace formed according to the method of FIG. 1.

However, as schematically depicted in FIG. 2, the inclusion of at least one suitable intermediate layer 30, prior to additively depositing one or more conductive structures 32 onto substrate 34, allows for both simple and very complex conductor pattern(s) to be maintained despite the high wetting angle between the substrate and conductive material. Providing sufficient energy to the first electrically conductive material can result in melting of the first electrically conductive material and the melted first electrically conductive material is substantially confined to the desired pattern of the first conductive structure. Since the first intermediate layer is selected to have a wetting angle relative to the substrate of less than 90°, the first intermediary layer will also stay in place during adhering step 16, which can involve sintering or curing depending on the precise composition and requirements of the intermediary. In certain embodiments, the first electrically conductive material has a wetting angle relative to a material defining the first intermediate layer of less than about 30°. The confining of conductive materials in this case has been found to significantly and rapidly increase below this threshold.

Figure 3A:
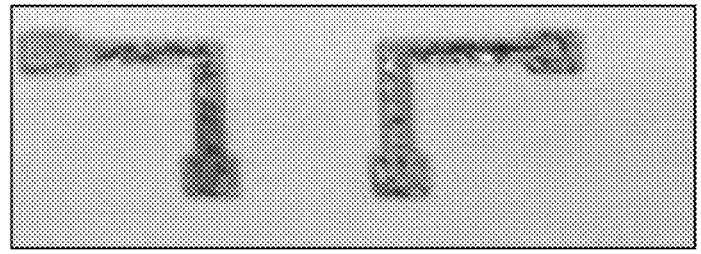
FIG. 3A is an image of a substrate with an intermediate layer.
Figure 3B:
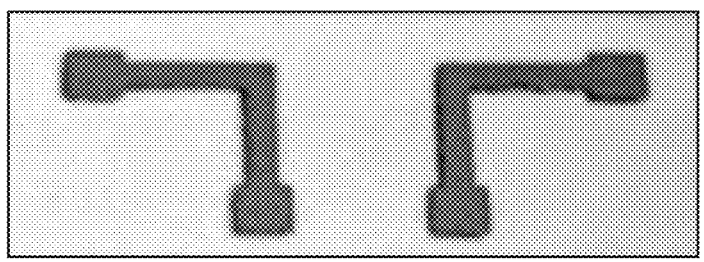
FIG. 3B is an image of an additively manufactured top layer on the intermediate layer of FIG. 3A.
Figure 3C:
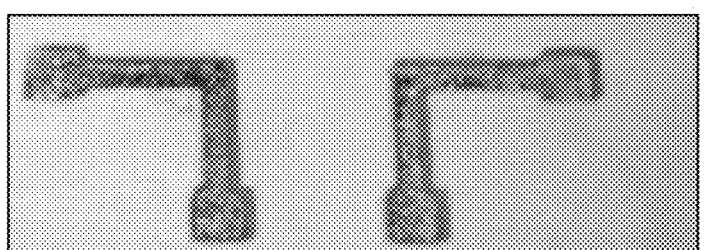
FIG. 3C is an image of the additively manufactured top layer of FIG. 3B after being consolidated to provide bulk-like properties.

In one illustrative example, images of which are shown in FIGS. 3A-3C, a substrate includes $Al_2O_3$ and the top functional conductive layer includes substantially pure copper. In this configuration, the first intermediate layer is $Mo_2C$. FIG. 3A shows an image after steps 12, 14, and 16 where $Mo_2C$ has been additively deposited in the pattern shown on the $Al_2O_3$ substrate, then subsequently sintered. In FIG. 3B, copper or a precursor ink having copper powder and polymer additives has been screen printed onto the assembly from FIG. 3A and in FIG. 3C is subsequently fired at 1200° C. under inert (argon) atmosphere. Note that the copper only wets the area containing the adhered $Mo_2C$, allowing for substantial increases in copper thickness and was shown to exhibit conductive properties essentially identical to those of bulk copper (including oxygen-free high-conductivity bulk copper) without an intermediate layer.

Regardless of the examples above, additional or alternatively suitable intermediate layers can include TiC, NiO, WC, $Fe_2O_3$, or $Cr_3C_2$. In certain embodiments, the first intermediate layer has an electrical conductivity less than an electrical conductivity of the functional conductive layer and more than an electrical conductivity of the substrate.

The first additive deposition step (of the first and optional subsequent intermediary materials) can include but is not necessarily limited to at least one of inkjet printing, screen printing, aerosol, extrusion, thermal spray, and micro-cold spray. In nearly all cases, the intermediate layer(s) are usually deposited and formed in a manner so as to minimize alloying with the first electrically conductive layer or precursor, and to promote adhesion to the substrate. The intermediate layer(s) and intermediary material(s) can also be selected to match or mediate the thermo-mechanical properties (e.g. thermal expansion) of the substrate relative to the functional conductive layer.

The electrically conductive material(s) or their precursor(s) could be provided via slurry, or in bulk form such as a thin film or powder, or any solid, liquid, gas, or plasma. In certain embodiments, the first electrically conductive material and its precursor can be additively deposited using at least one of printing and spraying. Prior to the final depositing step (of the electrically conductive layer or precursor), at least a second intermediate material can be deposited and adhered to the first intermediate layer. The second (and optional subsequent) intermediate layers can be adhered to the first intermediate layer to provide for the wetting angle between adjacent layers of less than 90° including between the top layer and uppermost intermediate layer.

The method can result in improved apparatus or electrical elements thereof with complex circuitry, traces and other conductive elements, taking advantage of the flexibility of additive manufacturing processes while also achieving bulk-like conductive properties, purity and minimal porosity not otherwise achievable in additive manufacturing to date. Apparatus and electrical elements known or expected to benefit can include copper elements of motors, high current switching circuits, actuators, solenoids, thermocouple junctions (Pt/Pd, Type B, or Type K), and integral Ni-Chrome or copper chrome heaters.

Additionally, the process enables a bulk attachment step (not shown) which can be performed separately or in conjunction with the above process steps. With sufficient conductive surface area, a bulk attachment step can include metallurgically bonding a preformed structure, such as but not limited to copper or other high surface area cooling fins, to at least a portion of the functional, electrically conductive top layer. In certain embodiments, the bulk attachment step includes brazing or ultrasonic welding.

Figure 4:
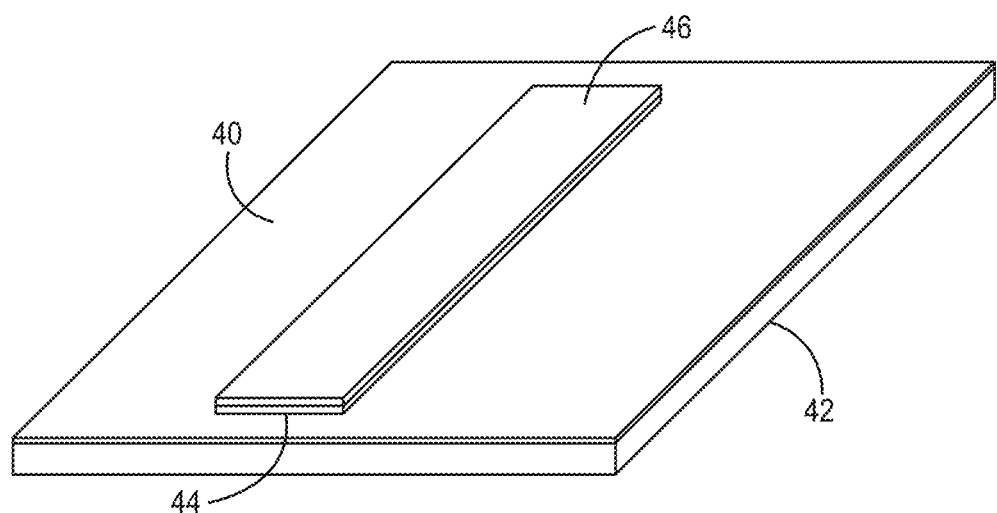
FIG. 4 schematically shows an alternative embodiment of an intermediate layer and basic copper trace with an electrically insulating surface layer on a metallic substrate.

FIG. 4 schematically shows an alternative embodiment formed according to the above-described method. Rather than a monolithic electrically insulating (e.g., alumina or other ceramic) substrate illustrated in FIG. 2, FIG. 4 includes electrically insulating surface layer 40 on metallic substrate 42. Similar to FIG. 2, however, at least one intermediate layer 44 is deposited, additively or otherwise, onto electrically insulating surface layer 40 with the appropriate wetting relationships (described above) to facilitate deposition of conductive layer (here, for example, a basic copper trace) 46.

Discussion of Possible Embodiments

The following are non-exclusive descriptions of possible embodiments of the present invention.

An embodiment of a method includes depositing a quantity of first intermediary material onto an electrically insulating substrate in a pattern corresponding to a desired pattern of a first conductive structure. The first intermediary material is adhered to the substrate to form a first intermediate layer to maintain the desired pattern of the first conductive structure. A quantity of a precursor of electrically conductive material is deposited generally along the pattern of the first intermediate layer. Energy is applied to enable migration and consolidation of the first electrically conductive material along the pattern of the first intermediate layer, forming a functional, electrically conductive top layer. At least one of the first electrically conductive material and its precursor has a wetting angle of less than 90° relative to the first intermediate layer, and a wetting angle greater than 90° relative to the substrate. At least one of the depositing steps is an additive deposition step.

The method of the preceding paragraph can optionally include, additionally and/or alternatively, any one or more of the following features, configurations and/or additional components:

A method according to an exemplary embodiment of this disclosure, among other possible things includes providing an electrically insulating substrate; depositing a quantity of first intermediary material onto the substrate in a pattern corresponding to a desired pattern of a first conductive structure; adhering the first intermediary material to the substrate to form a first intermediate layer on a portion of the substrate such that the first intermediate layer maintains the desired pattern of the first conductive structure; depositing a quantity of a precursor of a first electrically conductive material generally along the pattern of the first intermediate layer; and providing sufficient energy to at least the quantity of precursor of a first electrically conductive material to enable migration and consolidation of the first electrically conductive material along the pattern of the first intermediate layer, forming a functional, electrically conductive top layer; wherein at least one of the first electrically conductive material and its precursor has a wetting angle of less than 90° relative to the first intermediate layer, and a wetting angle greater than 90° relative to the substrate; and wherein at least one of the depositing steps is an additive deposition step.

A further embodiment of the foregoing method wherein the step of depositing a quantity of first intermediary material onto the substrate is a first additive deposition step and comprises at least one of inkjet printing, aerosol, extrusion, thermal spray, vapor deposition, screen printing, slurry deposition, and micro-cold spray.

A further embodiment of any of the foregoing methods, wherein the precursor for the first intermediary material comprises a powder, an ink, or a paste.

A further embodiment of any of the foregoing methods, wherein the adhering step comprises at least one of sintering the first intermediary material, and curing the first intermediary material to fix the first intermediate layer along the pattern.

A further embodiment of any of the foregoing methods, wherein the step of depositing a quantity of a precursor of a first electrically conductive material is a second additive deposition step and comprises at least one of printing, deposition, and spraying of the first electrically conductive material generally along the pattern of the first intermediate layer.

A further embodiment of any of the foregoing methods, wherein the quantity of the precursor of the first electrically conductive material comprises a powder, a wire, a foil, or a combination thereof.

A further embodiment of any of the foregoing methods, further comprising: prior to the step of depositing a quantity of a precursor of a first electrically conductive material, depositing a second intermediary material onto the first intermediate layer; and adhering the second intermediary material to the first intermediate layer to form a second intermediate layer.

A further embodiment of any of the foregoing methods, wherein depositing a second intermediary material onto the first intermediate layer comprises additively depositing the quantity of first electrically conductive material generally onto the second intermediate layer.

A further embodiment of any of the foregoing methods, wherein adhering the second intermediate layer to the first intermediate layer provides for a wetting angle of less than 90° between the first and second intermediate layers, and a total wetting angle of more than 90° between the substrate and the top layer.

A further embodiment of any of the foregoing methods, wherein the step of providing sufficient energy to the first electrically conductive material results in melting of the first electrically conductive material and the melted first electrically conductive material is substantially confined to the desired pattern of the first conductive structure.

A further embodiment of any of the foregoing methods, wherein the first electrically conductive material has a wetting angle relative to a material defining the first intermediate layer of less than 30°.

A further embodiment of any of the foregoing methods, further comprising a bulk attachment step, wherein a preformed structure is metallurgically bonded to at least a portion of the functional, electrically conductive top layer.

A further embodiment of any of the foregoing methods, wherein the bulk attachment step comprises brazing or ultrasonic welding.

A further embodiment of any of the foregoing methods, wherein the preformed structure comprises copper cooling fins.

A further embodiment of any of the foregoing methods, wherein the functional, electrically conductive top layer forms at least one electrical element for an apparatus, the apparatus or at least one electrical element selected from a motor, a high current switching circuit, a thermocouple junction, an integrated resistance heater.

A further embodiment of any of the foregoing methods, wherein the substrate comprises $Al_2O_3$ and the resulting functional, electrically conductive top layer comprises substantially pure copper.

A further embodiment of any of the foregoing methods, wherein the first intermediate layer comprises $Mo_2C$, $TiC$, $NiO$, $WC$, $Fe_2O_3$, $Cr_3C_2$, or combinations thereof.

A further embodiment of any of the foregoing methods, wherein the functional, electrically conductive top layer comprises copper, platinum, palladium, nickel, chrome, or combinations thereof.

An apparatus according to an exemplary embodiment of this disclosure, among other possible things includes an electrically insulating substrate; a first intermediate layer adhered to the substrate by way of at least one intermediary material additively deposited thereon substrate in a pattern corresponding to a desired pattern of a first conductive structure, the first intermediate layer maintaining the desired pattern of the first conductive structure; wherein the first intermediate layer has a wetting angle of less than 90° relative to the intermediate layer.

A further embodiment of the foregoing apparatus, further comprising a functional, electrically conductive top layer formed on or directly above the first intermediate layer by way of a first electrically conductive material additively deposited generally along the pattern of the first intermediate layer and subsequently migrated and consolidated along the pattern of the first intermediate layer; wherein the first electrically conductive material has a wetting angle greater than 90° relative to the substrate and a wetting angle of less than 90° relative to the first intermediate layer.

A further embodiment of any of the foregoing apparatus, wherein the apparatus is selected from motors, high current switching circuits, thermocouple junctions, and heaters.

A method according to an exemplary embodiment of this disclosure, among other possible things includes providing any of the foregoing apparatus; additively depositing a quantity of a precursor of a first electrically conductive material generally along the pattern of the first intermediate layer; and providing sufficient energy to at least the quantity of precursor of a first electrically conductive material to enable migration and consolidation of the first electrically conductive material along the pattern of the first intermediate layer, forming a functional, electrically conductive top layer; wherein at least one of the first electrically conductive material and its precursor has a wetting angle of less than 90° relative to the first intermediate layer, and a wetting angle greater than 90° relative to the substrate.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A method comprising:
providing an electrically insulating substrate;
depositing a quantity of first intermediary material onto the substrate in a pattern corresponding to a desired pattern of a first conductive structure;
adhering the first intermediary material to the substrate to form a first intermediate layer on a portion of the substrate such that the first intermediate layer maintains the desired pattern of the first conductive structure;
depositing a quantity of a precursor of a first electrically conductive material along the pattern of the first intermediate layer; and
providing sufficient energy to at least the quantity of precursor of a first electrically conductive material to enable migration and consolidation of the first electrically conductive material along the pattern of the first intermediate layer, forming a functional, electrically conductive top layer;
wherein at least one of the first electrically conductive material and its precursor has a wetting angle of less than 90° relative to the first intermediate layer, and a wetting angle greater than 90° relative to the substrate; and
wherein at least one of the depositing steps is an additive deposition step.

2. The method of claim 1, wherein the step of depositing a quantity of first intermediary material onto the substrate is a first additive deposition step and comprises at least one of inkjet printing, aerosol, extrusion, thermal spray, vapor deposition, screen printing, slurry deposition, and micro-cold spray.

3. The method of claim 2, wherein a precursor for the first intermediary material comprises a powder, an ink, or a paste.

4. The method of claim 1, wherein the adhering step comprises at least one of sintering the first intermediary material, and curing the first intermediary material to fix the first intermediate layer along the pattern.

5. The method of claim 1, wherein the step of depositing a quantity of a precursor of a first electrically conductive material is a second additive deposition step and comprises at least one of printing, and spraying of the first electrically conductive material along the pattern of the first intermediate layer.

6. The method of claim 5, wherein the quantity of the precursor of the first electrically conductive material comprises a powder, a wire, a foil, or a combination thereof.

7. The method of claim 1, further comprising:
prior to the step of depositing a quantity of a precursor of a first electrically conductive material, depositing a second intermediary material onto the first intermediate layer; and
adhering the second intermediary material to the first intermediate layer to form a second intermediate layer.

8. The method of claim 7, wherein depositing a second intermediary material onto the first intermediate layer comprises additively depositing the quantity of first electrically conductive material onto the second intermediate layer.

9. The method of claim 8, wherein adhering the second intermediate layer to the first intermediate layer provides for a wetting angle of less than 90° between the first and second intermediate layers, and a total wetting angle of more than 90° between the substrate and the top layer.

10. The method of claim 1, wherein the step of providing sufficient energy to the first electrically conductive material results in melting of the first electrically conductive material and the melted first electrically conductive material is substantially confined to the desired pattern of the first conductive structure.

11. The method of claim 1, wherein the first electrically conductive material has a wetting angle relative to a material defining the first intermediate layer of less than 30°.

12. The method of claim 1, further comprising a bulk attachment step, wherein a preformed structure is metallurgically bonded to at least a portion of the functional, electrically conductive top layer.

13. The method of claim 12, wherein the bulk attachment step comprises brazing or ultrasonic welding.

14. The method of claim 12, wherein the preformed structure comprises copper cooling fins.

15. The method of claim 1, wherein the functional, electrically conductive top layer forms at least one electrical element for an apparatus, the apparatus or at least one electrical element selected from a motor, a high current switching circuit, a thermocouple junction, an integrated resistance heater.

16. The method of claim 1, wherein the substrate comprises $Al_2O_3$ and the resulting functional, electrically conductive top layer comprises pure copper.

17. The method of claim 1, wherein the first intermediate layer comprises $Mo_2C$, TiC, NiO, WC, $Fe_2O_3$, $Cr_3C_2$, or combinations thereof.

18. The method of claim 1, wherein the functional, electrically conductive top layer comprises copper, platinum, palladium, nickel, chromium, or combinations thereof.

* * * * *